United States Patent
Self

(10) Patent No.: US 7,215,208 B2
(45) Date of Patent: May 8, 2007

(54) FULLY INTEGRATED FREQUENCY GENERATOR

(76) Inventor: Paul William Ronald Self, 3368 Creighton Pl., Santa Clara, CA (US) 95051

( * ) Notice: Subject to any disclaimer, the term of this patent is extended or adjusted under 35 U.S.C. 154(b) by 97 days.

(21) Appl. No.: 11/038,560

(22) Filed: Jan. 19, 2005

(65) Prior Publication Data
US 2007/0035351 A1    Feb. 15, 2007

(51) Int. Cl.
*H03L 7/04* (2006.01)
(52) U.S. Cl. .................. 331/16; 331/161; 327/157; 327/161
(58) Field of Classification Search ............... 327/157, 327/161; 331/16, 161
See application file for complete search history.

(56) References Cited

U.S. PATENT DOCUMENTS

| | | | |
|---|---|---|---|
| RE27,092 E * | 3/1971 | Stifter et al. .................. 342/98 |
| 4,042,891 A | 8/1977 | Levine |
| 4,115,744 A | 9/1978 | Lewis |
| 4,387,347 A | 6/1983 | Pierrot |
| 4,463,321 A | 7/1984 | Horner |
| 5,204,640 A | 4/1993 | Logan, Jr. |
| 5,570,054 A | 10/1996 | Takla |
| 5,687,261 A | 11/1997 | Logan |
| 5,696,951 A | 12/1997 | Miller |
| 5,949,290 A | 9/1999 | Bertram |
| 6,329,648 B1 | 12/2001 | Delatorre |
| 6,373,740 B1 | 4/2002 | Forbes et al. |
| 6,433,596 B1 * | 8/2002 | Bossard ...................... 327/157 |
| 6,525,618 B2 | 2/2003 | Wood |
| 6,556,089 B2 | 4/2003 | Wood |
| 6,593,821 B2 * | 7/2003 | Kobayashi .................... 331/74 |
| 6,622,370 B1 * | 9/2003 | Sherman et al. .............. 29/600 |
| 6,741,109 B1 | 5/2004 | Huang et al. |
| 6,816,020 B2 | 11/2004 | Wood |
| 7,085,336 B2 * | 8/2006 | Lee et al. .................... 375/354 |
| 7,119,591 B1 * | 10/2006 | Lin ............................ 327/158 |

OTHER PUBLICATIONS

Graf, Rudolf F., Modern Dictionary of Electronics, 1999, Newnes Publications, 7th ed., pp. 183,797.*

Andress et al., "Recent Developments in Standing-Wave Oscillator Design: Review", RFIC Symposium, 2004. Digest of Papers. 2004 IEEE, Jun. 6-8, 2004, p. 119-122.

Andress et al., "Standing Wave Oscillators Utilizing Wave-Adaptive Tapered Transmission Lines", IEEE Journal of Solid-State Circuits, Mar. 2005, p. 638-651, vol. 40, No. 3.

(Continued)

*Primary Examiner*—James E. Goodley
(74) *Attorney, Agent, or Firm*—Fountainhead Law Group PC; Chad R. Walsh

(57) ABSTRACT

Embodiments of the present invention include a frequency generator comprising a feedback loop with a transmission line integrated on a single integrated circuit. In one embodiment, a frequency generator comprises a phase detector and a voltage controlled oscillator coupled in series, and a transmission line having an input coupled to an output of the voltage controlled oscillator, the transmission line providing a time delay between the transmission line input and output, wherein the phase detector includes an input coupled to the transmission line output and another input coupled to the transmission line input. The phase detector, voltage controlled oscillator and transmission line are advantageously integrated on a single integrated circuit.

20 Claims, 4 Drawing Sheets

OTHER PUBLICATIONS

Andress et al., "A circular standing wave oscillator", IEEE International Solid-State Circuits Conference, Feb. 18, 2004.

Johnson et al. "High-Speed Digital Design", 1st edition, Apr. 8, 1993, p. 6, Prentice Hall PTR, USA.

Jeffrey Wilkins, "All-silicon Copernicus Clock generates 528MHz clock signal with no external components", Mobius Microsystems press release, Jun. 22, 2005.

* cited by examiner

FULLY INTEGRATED FREQUENCY GENERATOR

BACKGROUND

The present invention relates to frequency generators, and in particular, to frequency generator circuits and methods that can be fully integrated on a single integrated circuit.

In almost every computer system or digital system, there is a requirement for at least one signal having a specified frequency. One example of such a signal is a reference frequency signal (i.e., a timing reference). For example, a reference frequency signal may be a system clock. Signals with specified frequencies are created using frequency generators. One example of a frequency generator is a crystal oscillator. A crystal oscillator is an electrical circuit that uses a quartz crystal as a reference device to generate a frequency. Quartz crystals are piezoelectric devices that are made from crystalline silicon dioxide. When quartz crystals are driven by an electrical signal, they will exhibit a mechanical resonance (vibration) at certain frequencies of the driving signal. By using the appropriate electrical circuit, an electrical signal can be generated that is equal in frequency to the quartz crystal's mechanical resonant frequency. Such circuits are advantageous because quartz crystal may be used to generate very precise reference frequency signals.

Even though crystal oscillators have an advantage of being very accurate, they do have some well-known disadvantages. For example, since the creation of the reference frequency involves physically vibrating a silicon dioxide crystal at the reference frequency, over-driving the crystal with too large of an electrical signal can damage it. This damage to the quartz crystal can result in a shift of the resonant frequency, or in extreme cases the crystal can fracture. If a fracture were to occur, the crystal would become non-functional and the crystal oscillator would stop operating at the reference frequency. Sudden large changes in temperature can also damage the quartz crystal. Again, this damage could result in a shift of the crystal's resonant frequency or the fracture of the crystal. Another disadvantage associated with these crystal oscillators are their susceptibility to mechanical vibration or shock. A mechanical shock to the crystal can cause a sudden momentary shift in the oscillator frequency. This occurs because the shock can disturb the mechanical vibration of the quartz crystal. In the same manner, a constant mechanical vibration of the circuit board to which the crystal is attached can interfere with the mechanical vibration of the quartz crystal. A mechanical vibration of the circuit board would cause periodic variations of the output frequency of the crystal oscillator.

A particularly significant drawback to crystal oscillator circuits is that a quartz crystal cannot be integrated into a monolithic integrated circuit together with the electrical drive circuitry. The silicon dioxide crystal is always placed external to the integrated circuit, which contains the electrical devices that drive the crystal. Because the crystal is external to the integrated circuit, the crystal oscillator is much more susceptible to electrical disturbances from external sources. Signals adjacent to the quartz crystal can couple electrical disturbances into the leads of the crystal. These disturbances may result in variations of the output frequency of the oscillator circuit. Having the quartz crystal external to the integrated circuit may also result in the crystal oscillator being more susceptible to humidity and dirt. Accumulated moisture or dirt across the leads of the crystal would create a conduction path between the leads. If the resistance of this parasitic conduction path becomes too low, the crystal oscillator circuit would stop oscillating. Still another drawback to the crystal oscillator is related to economics. Since the quartz crystal is external and separate from the integrated circuit that drives it, additional costs are incurred. One additional cost is due to the extra assembly costs required to attach the external crystal to the printed circuit board. Another additional cost is due to the extra printed circuit board space that is used.

Despite these many disadvantages, crystal oscillators are very popular because they are capable of generating extremely accurate reference frequency signals. The precision of the output frequencies from these crystal oscillator circuits is on the order of 0.01%. However, in many applications such a high level of precision is not required. For example, in many digital systems a precision on the order of 1.0% for the system clock is sufficient.

Thus, there is a need for improved frequency signal generators over existing crystal oscillator techniques. In particular, there is a need for a frequency generator that is fully integrated on a single integrated circuit. The present invention solves these and other problems by providing a frequency generator that can be fully integrated on a single integrated circuit. Features and advantages of the present invention include providing a frequency generator with improved reliability and lower cost.

SUMMARY

Embodiments of the present invention include a frequency generator comprising a feedback loop with a transmission line integrated on a single integrated circuit. In one embodiment, a frequency generator comprises a phase detector and a voltage controlled oscillator coupled in series, and a transmission line having an input coupled to an output of the voltage controlled oscillator, the transmission line providing a time delay between the transmission line input and a transmission line output, wherein the phase detector includes an input coupled to the transmission line output and another input coupled to the transmission line input. The phase detector, voltage controlled oscillator and transmission line are advantageously integrated on a single integrated circuit.

The following detailed description and accompanying drawings provide a better understanding of the nature and advantages of the present invention.

DETAILED DESCRIPTION

Described herein are techniques for generating reference frequencies on an integrated circuit. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

Embodiments of the present invention include a fully integrated frequency generator that uses a feedback loop to force a voltage controlled oscillator (VCO) to have a period equal to the time delay of an integrated transmission line. The integrated transmission line (ITL) resides on the same monolithic silicon die along with other circuitry contained within each of the functional blocks of the frequency generator. Embodiments of the invention include a frequency generator that is totally integrated and uses no external devices such as a quartz crystal as a reference device. The integrated transmission line may be used as the timing reference device for the frequency generator. The frequency generator may be used to generate a digital system clock, for example.

Figure 1:
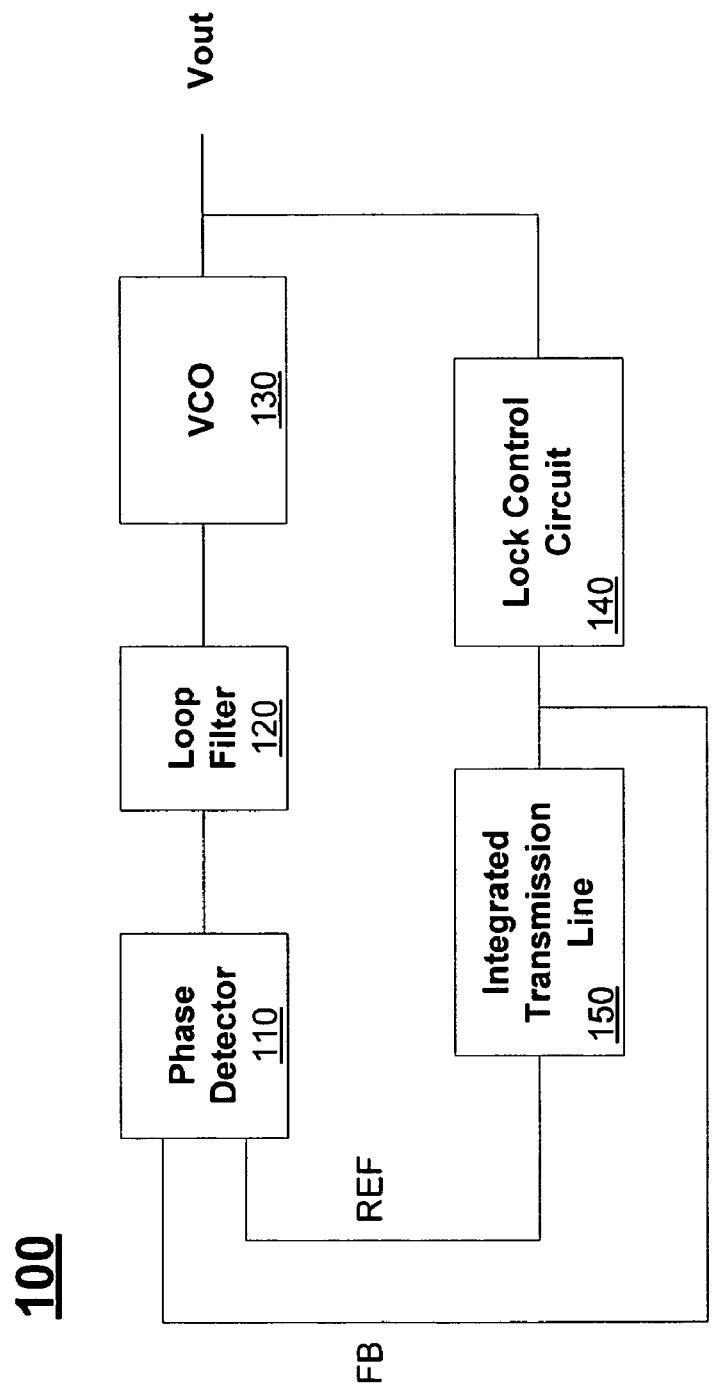
FIG. 1 illustrates a frequency generator according to one embodiment of the present. invention.

FIG. 1 illustrates a frequency generator according to one embodiment of the present invention. Frequency generator 100 includes a feed forward path of a feedback loop comprising a phase detector ("PD") 110, loop filter 120 and voltage controlled oscillator ("VCO") 130 coupled in series. PD 110 may detect the phase difference of two input signals REF and FB. In some specific embodiments, PD 110 may include a charge pump (not shown) for translating phase differences between REF and FB into currents that are received by loop filter 120 and translated into a voltage. The output of the PD 110 is coupled to the input of VCO 130 through loop filter 120, which may be a resistor and capacitor connected in series, for example. VCO 130 generates a signal, $V_{OUT}$, having a frequency, $F_{OUT}$, that is dependent on the voltage received from filter 120. The output of the VCO may be the output of the system, which may be used as a reference signal such as a system clock, or which may be used to generate yet other signals at other frequencies.

The output of the VCO is also provided through a feedback path of the feedback loop to the two inputs of PD 110. The feedback path includes an integrated transmission line 150 for introducing a delay that acts as the timing reference for the frequency generator. The delay caused by the integrated transmission line is referred to herein synonymously as "time delay" and "flight time delay." For instance, the signal at the VCO output may be delayed by a predetermined amount of time as it passes through integrated transmission line 150. The delayed VCO output signal is then received at one input of PD 110. An undelayed version of the VCO output signal is provided to the other input of PD 110. Thus, PD 110 receives both delayed and undelayed versions of the VCO output through the feedback path. The action of the loop will cause the period of the VCO output signal to be the same as the delay caused by integrated transmission line 150.

Embodiments of the present invention may also include lock control circuit 140. To achieve desired performance, frequency generator 100 should operate so that the period of the VCO output signal, Tvco (i.e., $1/F_{OUT}$, where Fout is the frequency of the VCO output signal), is equal to the value of the integrated transmission line's flight time delay, $\tau_{TL}$. Some embodiments of the invention may include a lock control circuit 140 to help eliminate any ambiguity as to what value the period of $V_{OUT}$ will be locked. Lock control circuit 140 acts as a lock acquisition aid for the system so that the VCO output signal has a period equal to the time delay of the integrated transmission line. For example, lock control circuit 140 may ensure that the phase detector is locking to appropriate edges of the feedback signals REF and FB. Without lock control circuit 140, Tvco could lock to a value that is equal to $\tau_{TL}$ divided by an integer. That is, instead of locking to a value equal to $\tau_{TL}$, $T_{VCO}$ could lock to a value equal to $\tau_{TL}/2$ or $\tau_{TL}/3$ or $\tau_{TL}/4$ etc. Lock control circuit 140 guarantees that PD 110 will only compare two successive rising edges of $V_{OUT}$. Without lock control circuit 140, the loop could potentially enter a locked condition where PD 110 is comparing two non-successive rising edges of $V_{OUT}$. If the loop enters a stable state where PD 110 is comparing non-successive edges from the VCO, this would mean that Tvco would be locked to a value equal to $\tau_{TL}/2$ or $\tau_{TL}/3$ or $\tau_{TL}/4$ etc. By introducing lock control circuit 140 in the loop, only successive rising edges will be compared by PD 110, and $T_{VCO}$ will be forced to only equal $\tau_{TL}$. In this example, lock control circuit 140 is between VCO 130 and integrated transmission line 150. However, lock control circuit 140 may be located at a variety of positions in the circuit and may further include connections to control the operation of other loop blocks.

Frequency generator circuits require some form of reference device to set the time base of the signals (i.e., a timing reference or frequency reference). A good reference device should be accurate, repeatable, and predictable. Moreover, such devices should be stable with temperature changes and power supply voltage changes. Developing a good timing or frequency reference device that can be integrated into an integrated circuit is extremely difficult. A quartz crystal, for example, cannot be built into an integrated circuit, but rather, must reside external to the integrated circuit that drives it. Typically, in an integrated circuit the RC time constant of a resistor and capacitor network has been used as a timing reference. Resistors and capacitors can be built into an integrated circuit, but an integrated circuit RC time constant can exhibit unacceptable variations due to variations in the manufacturing process. For example, the value of an integrated resistor can vary as much as +/−20%, and the value of an integrated capacitor can vary as much as +/−10% because of variations in the manufacturing process. Thus, the time constant of an integrated resistor and capacitor network is not very repeatable. Moreover, the value of an integrated resistor can change significantly over a temperature range. The value of an integrated resistor will typically change by 7% over a temperature range of 70 degrees Celsius. Therefore, the RC time constant of an integrated circuit resistor and capacitor network is not stable with temperature. Because of the wide changes in value due to manufacturing and temperature variations, an integrated circuit resistor and capacitor network does not make a good timing reference device.

Embodiments of the present invention include building an integrated transmission line (ITL) into an integrated circuit as the timing reference device. The flight time delay of the transmission line may be used as a timing reference for a frequency generator integrated on the same chip. Time delay in a transmission line is caused by the propagation of electromagnetic waves down the transmission line. Such time delays may further include some delay caused by parasitic resistances of the delay line. Embodiments of the present invention may preferably minimize the delay effects of parasitic resistances because such resistances may cause the time delay of an integrated transmission line to vary across process and temperature. More generally, the flight time delay of a transmission line depends on a variety of parameters, including geometric shape, length, construction, and the relative dielectric constant of the transmission line's insulator. One common transmission line is stripline. The flight time delay for a stripline transmission line can be calculated from the following equation:

$$\tau_{TL} = (L_{TL}(\in_r)^{1/2})/c_o$$

where,
$\tau_{TL}$=flight time delay of the transmission line
$L_{TL}$=length of the transmission line
$\in_r$=relative dielectric constant of the transmission line insulator.
$c_o$=the speed of light in a vacuum.

These equations apply to transmission lines with fields contained in a single dielectric. Examples of such transmission lines include stripline and coax. However, these equations are illustrative only. The present invention may use any integrated transmission line that produces a stable time delay, such as microstrip, for example, and others.

Stability and repeatability advantages of using an integrated transmission line in a frequency generator can be seen by examining the terms of the flight time delay equation. The length of the integrated transmission line, $L_{TL}$, may be set by design choice. Once the value of the term $L_{TL}$ is designed, an integrated transmission line will have negligible changes in length due to variations in the manufacturing of the integrated circuit.

With regard to the other parameters effecting flight time delay, the term $c_o$ is the speed of light in a vacuum, which is a physical constant that is invariable. The value of the term $\in_r$ depends on the dielectric material used as the insulator for the integrated transmission line. In the current manufacturing environment, the most common insulator for a transmission line on an integrated circuit would be amorphous silicon dioxide. The relative dielectric constant, $\in_r$, for silicon dioxide does not change with manufacturing variations and exhibits only a very small variation due to temperature changes. The temperature coefficient for silicon dioxide's relative dielectric constant is approximately 20 ppm/° C. The variation of $\in_r$ due to temperature change translates into a temperature coefficient for $\tau_{TL}$ of approximately 10 ppm/° C. For a 70° C. change in temperature, the total variation of $\tau_{TL}$ should be less than 0.1% due to the variation in $\in_r$.

Another advantage of an integrated transmission line is that the time delay of an integrated transmission line is not dependent on the magnitude of the signal that is propagating along the transmission line. Thus, the time delay, $\tau_{TL}$, is independent of the power supply voltage of the integrated circuit. Using the integrated transmission line as a timing reference, it is possible to create a frequency generator that has a total frequency variation of less than +/−1.0%. This total variation would include all of the variations due to manufacturing, temperature, and power supply voltage. Therefore, embodiments of the present invention advantageously include both a transmission line (to act as a timing reference) and other frequency generator circuitry on the same integrated circuit.

In some embodiments, the present invention may use one or more conductive interconnect layers (e.g., metalization) for constructing an integrated circuit transmission line. For example, connecting multiple metalization layers in parallel can reduce the resistance of the integrated transmission line, resulting in an improved transmission line. One common metalization material is aluminum. Additionally, other processes may use one or more copper metalizations as the transmission line. Since copper has a lower sheet resistance than aluminum, the use of copper for the integrated transmission line can reduce its resistance even more. Of course, other conductive materials could be used. Furthermore, embodiments of the present invention may use very high speed transistor devices. These fast devices allow the designer to create on-chip high-speed components included in a frequency generator using an integrated transmission line as a timing reference device.

Figure 2:
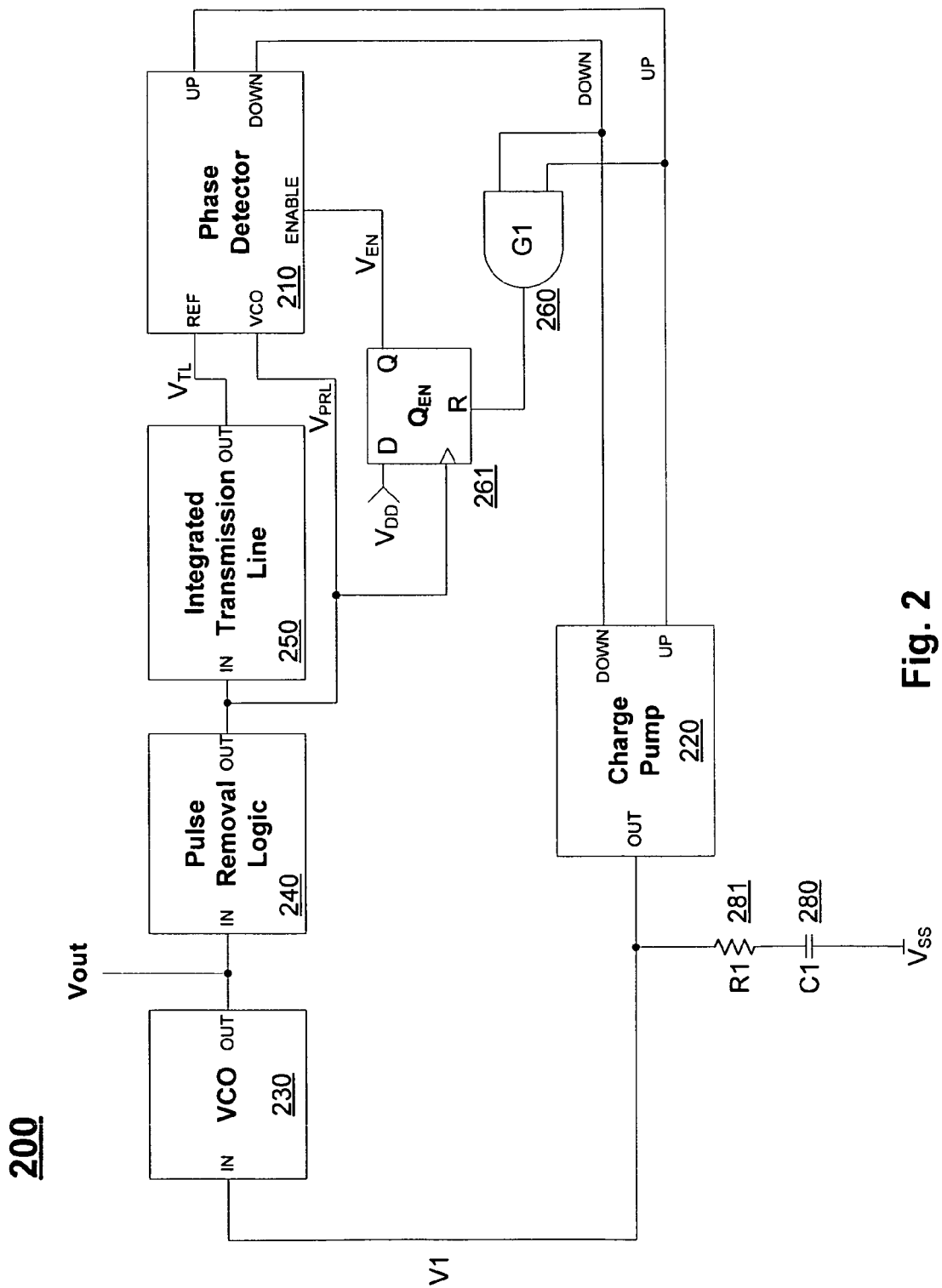
FIG. 2 illustrates a frequency generator according to another embodiment of the present invention.

FIG. 2 illustrates a frequency generator according to another embodiment of the present invention. Frequency generator 200 includes a voltage controlled oscillator ("VCO") 230, a phase detector 210, a charge pump 220, an integrating capacitor ("$C_1$") 280 and zero resistor ("$R_1$") 281, pulse removal logic 240, integrated transmission line 250 and an enable control circuit including AND gate 260 and D-type flip flop ("DFF") 261. Integrated transmission line 250 introduces a delay in the feedback path for controlling the frequency of the VCO output signal. Pulse removal logic 240 and enable control circuits 260-261 are the lock control circuits for this example. These circuits eliminate ambiguity as to what value the period of $V_{OUT}$ will be locked to. The operation of frequency generator 200 may be referred to as either phase locked loop ("PLL") operation, because it includes a phase detector and VCO, or as delay locked loop ("DLL") operation because it forces the period of the voltage controlled oscillator to be equal to the flight time delay of the integrated transmission line.

Figure 3:
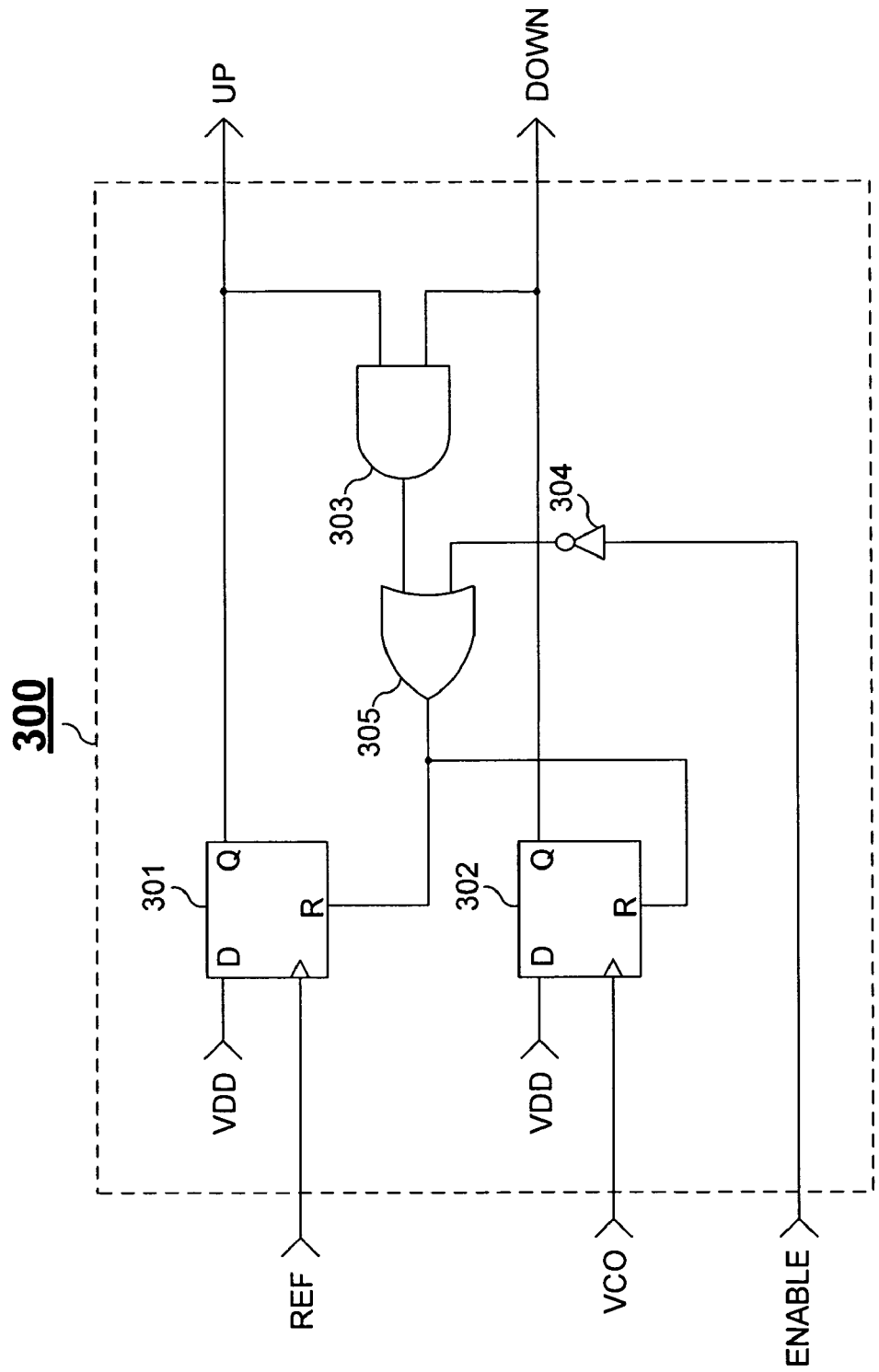
FIG. 3 is an example of a phase detector according to one embodiment of the present invention.

FIG. 3 is an example of a phase detector according to one embodiment of the present invention. Phase detector 300 includes two D-type flip flops 301 and 302 ("DFF"), AND gate 303, inverter 304 and OR gate 305. In this example, AND gate 303, inverter 304 and OR gate 305 provide both enable and self-reset functions for phase detector 300. DFF 301 is initialized into a logic low state (e.g., Vss or ground) and receives signal REF as a clock input, which in frequency generator 200 is the output of the integrated transmission line 250 (i.e., the delayed VCO output signal). The D-input is connected to power supply Vdd. Thus, when the phase detector receives the delayed signal, the Q-output switches from low to high. Similarly, DFF 302 receives signal VCO as a clock input, which in frequency generator 200 is the output of the pulse removal logic 240 (i.e., the undelayed VCO output signal). The D-input of DFF 302 is also connected to power supply Vdd. Thus, when the phase detector receives the undelayed signal, the Q-output switches from low to high. Regardless of whether REF or VCO is received first, the circuit is reset to low logic state when both outputs are high using AND gate 303, which has inputs connected to the Q-outputs of DFFs 301 and 302 and an output coupled to the reset terminal of each DFF 301 and 302 through OR gate 305. Phase detector 300 also includes an ENABLE input. When the ENABLE input is in a high logic state (e.g., Vdd), the output of inverter 304 is logic low and phase detector 300 is enabled. However, when the ENABLE input is in a low logic state, then the output of inverter 304 is high and phase detector 300 is disabled because the reset is held high. A high logic level for reset forces the Q outputs of the DFFs 301 and 302 to logic low levels.

Figure 4:
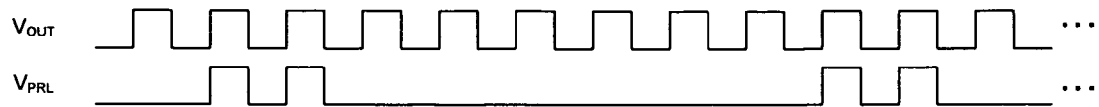
FIG. 4 is an example waveform to illustrate pulse removal according to one embodiment of the present invention.
Figure 5:
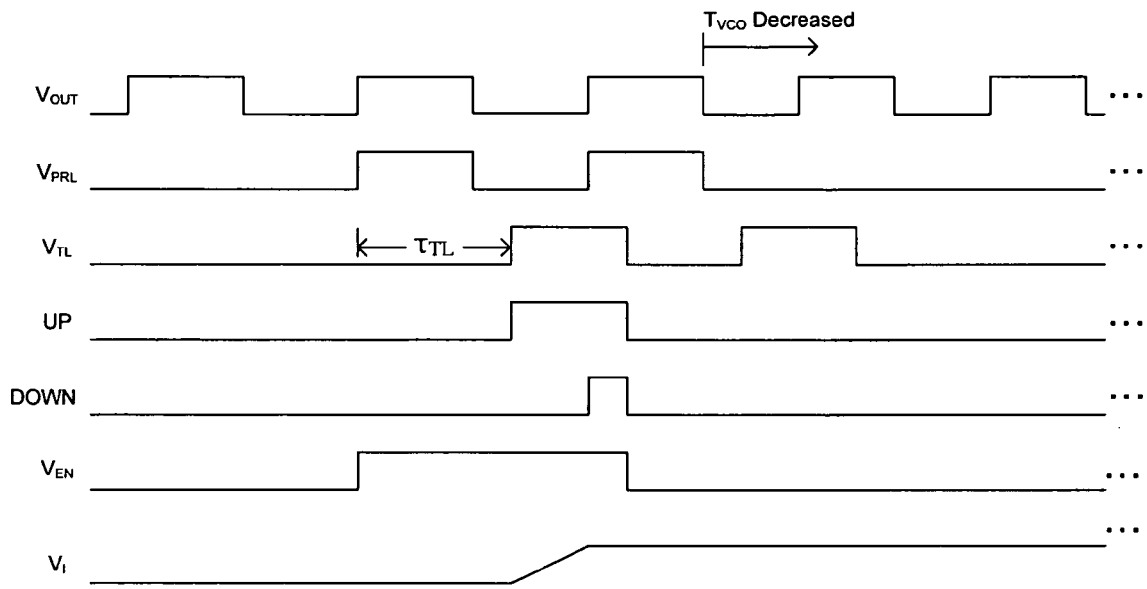
FIG. 5 is a timing diagram to illustrate the operation of a frequency generator according to one embodiment of the present invention.
Figure 6:
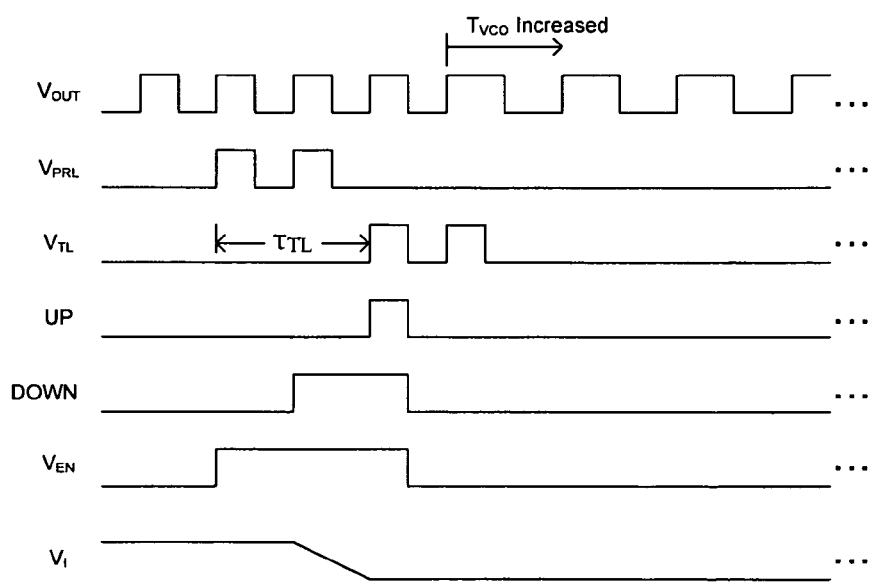
FIG. 6 is another timing diagram to illustrate the operation of a frequency generator according to one embodiment of the present invention.

The operation of frequency generator 200 using the example phase detector 300 can be understood by referring to timing diagrams found in FIGS. 4–6. FIG. 4 is an example waveform to illustrate pulse removal according to one embodiment of the present invention. The timing diagram of FIG. 4 shows the operation of the pulse removal logic ("PRL") 240. PRL 240 removes pulses from the signal $V_{OUT}$, which is the output of the VCO 230. In the example shown in FIG. 4, $V_{PRL}$ is generated by deleting 75% of the $V_{OUT}$ pulses. Depending on the requirements for the loop, a higher percentage or a lower percentage of the pulses could be removed. In one embodiment, at least a majority of the pulses are removed. The percentage of pulses removed may range from 50% to a little less than 100%. PRL 240, together with the enable control circuits 260 and 261 and the ENABLE function of the phase detector ("PD") 210 are included in the loop in order to eliminate any ambiguity as to what value the period of $V_{OUT}$ will be locked to. To achieve desired performance, frequency generator 200 should operate so that the period of the VCO output signal, Tvco, is equal to the value of the integrated transmission line's flight time delay, $\tau_{TL}$. Without pulse removal logic 240, Tvco could lock to a value that is equal to $\tau_{TL}$ divided by an integer. That is, instead of locking to a value equal to $\tau_{TL}$, $T_{VCO}$ could lock to a value equal to $\tau_{TL}/2$ or $\tau_{TL}/3$ or $\tau_{TL}/4$, etc. PRL 240 and the ENABLE input of PD 210 guarantee that PD 210 will only compare two successive rising edges of $V_{OUT}$. Without PRL 240 and the PD ENABLE, the loop could potentially enter a locked condition where PD 210 is comparing two non-successive rising edges of $V_{OUT}$. If the loop enters a stable state where PD 210 is comparing non-successive edges from the VCO, this would mean that Tvco would be locked to a value equal to $\tau_{TL}/2$ or $\tau_{TL}/3$ or $\tau_{TL}/4$, etc. Thus, some embodiments of the present invention may include PRL 240 and an ENABLE function in PD 210, or other lock control circuitry, so that $T_{VCO}$ will be forced to equal $\tau_{TL}$.

FIG. 5 is a timing diagram to illustrate the operation of a frequency generator according to one embodiment of the present invention. The timing diagram found in FIG. 5 illustrates the behavior of the circuit when $T_{VCO}$ is too long (i.e., $F_{OUT}$ is too low). As is shown in FIG. 5 the output of PRL 240, $V_{PRL}$, contains pulses that have the same pulse width as those of its input, which is the output of VCO 230, $V_{OUT}$. However, the number of pulses in $V_{PRL}$ is reduced from the number found in $V_{OUT}$. $V_{TL}$ is a delayed version of $V_{PRL}$ with a time delay equal to $\tau_{TL}$. Initially, $V_{PRL}$, $V_{TL}$, $V_{EN}$, UP and DOWN are all logic low. With $V_{EN}$ being low, the ENABLE function of the PD is de-asserted which forces the PD outputs, UP and DOWN, to logic low states. The first rising edge of $V_{PRL}$ clocks the D-flip flop $Q_{EN}$ 261, which results in $V_{EN}$ going to a logic high state. When $V_{EN}$ goes high, PD ENABLE becomes asserted which means that the outputs of the PD are allowed to change states as a function of the PD inputs, VCO and REF. Because of the propagation delay of the D-flip flop $Q_{EN}$, the PD ENABLE is not asserted for the first rising edge of $V_{PRL}$, and therefore, the PD does not respond to the first rising edge of $V_{PRL}$. In this example, the period of $V_{OUT}$, Tvco, and thus the period of $V_{PRL}$, is longer than $\tau_{TL}$. Since $\tau_{TL}$ is shorter than Tvco, the first rising edge that the PD responds to comes from $V_{TL}$. The rising edge of $V_{TL}$ causes the UP output of the PD to go to a logic high. An UP signal going high before the DOWN signal goes high indicates that the frequency of the VCO needs to increase (i.e., $T_{VCO}$ needs to decrease). A high logic level for the UP input of the charge pump ("CP") 220 causes the CP to turn on a charging current source (not shown), which charges the capacitor ("$C_1$") 280. The CP charging current into $C_1$ results in a voltage ramp in the positive direction for $V_1$, thereby increasing the frequency of Vout (i.e., decreasing the period $T_{VCO}$). The decrease in Tvco is shown in the timing diagram of FIG. 5. The end result is that the feedback loop causes Tvco to move in a direction to bring it closer in value to $\tau_{TL}$, which is the time delay of the integrated transmission line.

When $V_{PRL}$ goes high the second time, the PD responds by forcing the DOWN output signal high. For a short amount of time both PD outputs, UP and DOWN, are at logic highs simultaneously. When DOWN goes to a logic high, the CP will turn on a discharging current source (not shown). Thus, while the UP and DOWN signals are both high, current sources in the charge pump are charging and discharging capacitor ("$C_1$") 280 simultaneously. In one embodiment the charge pump current sources are equal in value, and therefore, when the DOWN signal goes high the charging of $C_1$ ends and the positive voltage ramp of $V_1$ stops. When both PD outputs (i.e., UP and DOWN) are logic high, DFFs 301 and 302 in the PD are reset through AND gate 303 and OR gate 305, causing both PD outputs to go logic low simultaneously. When both PD outputs are logic high, AND gate 260 is also activated. Thus, AND gate 260 generates a signal that resets D-flip flop $Q_{EN}$, which results in $V_{EN}$ going to a logic low.

FIG. 6 is another timing diagram to illustrate the operation of a frequency generator according to one embodiment of the present invention. The timing diagram of FIG. 6 illustrates the behavior of the invention when $T_{VCO}$ is too short (i.e. the $F_{OUT}$ is too high). Initially, $V_{PRL}$, $V_{TL}$, $V_{EN}$, UP and DOWN are all logic low. The first rising edge of $V_{PRL}$ clocks D-flip flop $Q_{EN}$ which results in $V_{EN}$ going to a logic high. When $V_{EN}$ goes high, PD ENABLE becomes asserted, which means that the outputs of the PD are allowed to change states as a function of the PD inputs, VCO and REF. As was previously explained, because of the propagation delay of the D-flip flop $Q_{EN}$, the PD ENABLE is not asserted for the first rising edge of $V_{PRL}$. Therefore, the PD does not respond to the first rising edge of $V_{PRL}$. Since $T_{VCO}$ is shorter than $\tau_{TL}$, the PD responds first to the second rising edge of $V_{PRL}$. When the second rising edge of $V_{PRL}$ occurs, the DOWN output of the PD goes to a logic high. A DOWN signal going high before the UP signal goes high indicates that the frequency of the VCO needs to decrease (i.e., $T_{VCO}$ needs to increase). A high logic level for the DOWN input of CP 220 causes the CP to turn on a discharge current source. The discharging current source results in charge being removed from $C_1$ and also results in a negative going voltage ramp for $V_1$. When the first rising edge of $V_{TL}$ occurs, the PD responds by forcing the UP output to a high logic level. When the UP input of the CP goes to a high logic level, the CP turns on a charging current source. At this point both the charging and discharging current sources on the output of the CP are turned on. Because the current sources are of equal value, the discharge of $C_1$ ends and the negative going voltage ramp of $V_1$ stops. For a short amount of time both the UP signal and DOWN signal are at logic highs simultaneously, and then the PD resets itself which results in both PD outputs (UP and DOWN) going to logic lows simultaneously. At the same time that the PD resets itself, AND gate 260 generates a signal that resets D-flip flop $Q_{EN}$, causing $V_{EN}$ to go to a logic low. A low $V_{EN}$ de-asserts the ENABLE function of the PD. The lower voltage of $V_1$ causes the period of the VCO to increase (i.e., the frequency of the VCO decreases). This increase in Tvco is shown in the timing diagram of FIG. 6. Again, the result is that the feedback loop has caused Tvco to move in a direction to bring it closer in value to $\tau_{TL}$.

In the manner described in the previous paragraphs, the loop will gradually adjust $V_1$ and the period of the VCO until the value of $T_{VCO}$ matches the flight time delay of the integrated transmission line. Thus, one can see that an integrated transmission line can be used as a timing reference for a completely integrated oscillator rather than using an external device such as a quartz crystal as a reference.

The above description illustrates various embodiments of a fully integrated frequency generator with an integrated transmission line along with examples of how aspects of the present invention may be implemented. The above examples and embodiments are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A frequency generator comprising:
    a phase detector having first and second inputs and a first output;
    a loop filter coupled to the output of the phase detector;
    a voltage controlled oscillator coupled to the loop filter, the voltage controlled oscillator receiving a first voltage on a VCO input and generating a first signal on a VCO output having a frequency that is dependent on the first voltage, and wherein the VCO output is coupled to the first input of the phase detector;
    a transmission line having an input coupled to the VCO output for receiving the first signal and an output coupled to the second input of the phase detector, the transmission line providing a time delayed version of the first signal to the second input of the phase detector,
    wherein the phase detector, the loop filter, the voltage controlled oscillator and the transmission line are integrated on a single integrated circuit.

2. The frequency generator of claim 1 wherein the integrated transmission line comprises one or more conductive interconnect layers.

3. The frequency generator of claim 2 wherein the integrated transmission line comprises a plurality of metalization layers arranged in parallel.

4. The frequency generator of claim 2 wherein conductive interconnect layers are aluminum or copper.

5. The frequency generator of claim 1 further comprising a lock control circuit.

6. The frequency generator of claim 5 wherein the lock control circuit comprises pulse removal logic.

7. The frequency generator of claim 1 wherein the transmission line is stripline or microstrip.

8. A frequency generator comprising:
    a phase detector and a voltage controlled oscillator coupled in series; and
    a transmission line having an input coupled to an output of the voltage controlled oscillator, the transmission line providing a time delay between the transmission line input and a transmission line output,
    wherein the phase detector includes a first input coupled to the transmission line output and a second input coupled to the transmission line input, and wherein the phase detector, the voltage controlled oscillator and the transmission line are integrated on a single integrated circuit.

9. The frequency generator of claim 8 wherein the integrated transmission line comprises one or more metalization layers.

10. The frequency generator of claim 9 wherein the integrated transmission line comprises a plurality of metalization layers arranged in parallel.

11. The frequency generator of claim 8 further comprising a lock control circuit.

12. The frequency generator of claim 8 further comprising pulse removal logic coupled between the voltage controlled oscillator and the transmission line.

13. The frequency generator of claim 12 wherein the phase detector includes an enable input coupled to the transmission line input.

14. The frequency generator of claim 13 further comprising a D-type flip flop having an input coupled to the transmission line input and an output coupled to an enable input of the phase detector.

15. The frequency generator of claim 14 further comprising an AND gate having a first input coupled to a first output of the phase detector, a second input coupled to a second output of the phase detector and an output coupled to a reset input of the D-type flip flop.

16. A method of generating a frequency comprising:
    generating a first signal having a first frequency at the output of a feedback loop;
    coupling the first signal to a first input of a phase detector in the feedback loop;
    generating a second signal in a transmission line, wherein the second signal is time delayed version of the first signal; and
    coupling the second signal to a second input of the phase detector in the feedback loop,
    wherein the feedback loop and the transmission line are integrated on the same integrated circuit.

17. The method of claim 16 wherein the first signal has a period equal to the time delay between the first and second signals.

18. The method of claim 16 further comprising removing pulses from the first signal.

19. The method of claim 16 further comprising enabling the phase detector when a pulse in the first signal is detected.

20. The method of claim 16 wherein the integrated transmission line comprises one or more metalization layers arranged in parallel.

* * * * *